United States Patent [19]
Nagata et al.

[11] 3,891,872
[45] June 24, 1975

[54] THICKNESS-EXTENSIONAL MODE PIEZOELECTRIC RESONATOR WITH POISSON'S RATIO LESS THAN ONE-THIRD

[75] Inventors: Takashi Nagata, Ikeda, Japan; Raymond David Mindlin, New York, N.Y.

[73] Assignee: Matsushita Electric Industrial Co., Ltd., Osaka, Japan

[22] Filed: June 20, 1974

[21] Appl. No.: 481,451

Related U.S. Application Data

[63] Continuation of Ser. No. 304,417, Nov. 7, 1972, abandoned.

[30] Foreign Application Priority Data

Nov. 12, 1971 Japan .............................. 46-90816
Nov. 12, 1971 Japan .............................. 46-90817

[52] U.S. Cl. .................. 310/9.5; 310/8.2; 310/9.6; 310/9.7; 333/72
[51] Int. Cl. .............................................. H01v 7/00
[58] Field of Search .......... 310/8, 8.2, 9.5, 9.6, 9.7; 333/72

[56] References Cited

UNITED STATES PATENTS

| | | | |
|---|---|---|---|
| 3,222,622 | 12/1965 | Curran | 310/9.5 X |
| 3,363,119 | 1/1968 | Koneval et al. | 310/9.5 |
| 3,384,768 | 5/1968 | Shockley et al. | 310/9.5 |
| 3,396,287 | 8/1968 | Horton | 310/9.1 |
| 3,401,276 | 9/1968 | Curran et al. | 310/9.5 X |
| 3,576,453 | 4/1971 | Mason | 310/8.2 |
| 3,585,418 | 6/1971 | Koneval | 310/8.2 |
| 3,694,677 | 9/1972 | Guttwein | 310/9.6 |
| 3,699,484 | 10/1972 | Berlincourt | 310/9.5 X |

OTHER PUBLICATIONS

Electronics and Communications in Japan, Vol. 55-C, No. 7, 1972, pp. 93–98.

*Primary Examiner*—Mark O. Budd
*Attorney, Agent, or Firm*—Wenderoth, Lind & Ponack

[57] ABSTRACT

A piezoelectric resonator comprising a thin and flat plate of piezoelectric material having a recess provided at least on one of two major surfaces thereof and a pair of electrodes applied to both of the major surfaces at the position of the recess. The piezoelectric plate has a Poisson's ratio of less than one third and mode in the thickness-extensional vibration when an electrical signal is applied between the electrodes. The relation between the thickness of the plate at the recess and the thickness of the plate at the flat part is such as to make the wave number of the flat part imaginary at the resonant frequency of the thickness-extensional vibration of the recess part.

9 Claims, 11 Drawing Figures

THICKNESS-EXTENSIONAL MODE PIEZOELECTRIC RESONATOR WITH POISSON'S RATIO LESS THAN ONE-THIRD

This is a continuation of application Ser. No. 304,417, filed Nov. 7, 1972, now abandoned.

BACKGROUND OF THE INVENTION

This invention relates to a piezoelectric resonator, and particularly to a piezoelectric resonator vibrating in the thickness-extensional mode at a pre-selected frequency with unwanted vibration responses suppressed.

The resonant frequency of a piezoelectric resonator vibrating in the thickness mode is inversely proportional to the thickness of the resonator. Accordingly, the resonator is widely used in the high frequency range in the form of a thin element.

However, conventionally such a thickness mode vibrating piezoelectric resonator has a defect in that it is difficult to suppress or eliminate the unwanted vibration responses which exist in the desired thickness vibration response and/or near that response. Several methods have been proposed to dissolve such defect. For example, U.S. Pat. No. 2,249,933 discloses a method of making the electrode area smaller than one half of the area of the piezoelectric plate. U.S. Pat. No. 3,384,768 discloses a method of making the resonant frequency of the region of the resonator where the electrode is applied lower than that of the region having no electrode thereon. On the other hand, U.S. Pat. No. 3,363,119 discloses a method of providing a recess and electrodes on the piezoelectric plate so as to make the resonant frequency range of the portion of the plate having the electrode thereon lower than the range of the portion of the plate having no electrode thereon.

However, for a piezoelectric resonator having a Poisson's ratio of less than on third, in spite of many attempts and great efforts, none of the conventional methods including the ones described above have succeeded in suppressing the unwanted vibration responses of the piezoelectric resonator vibrating in the thickness-extensional mode.

SUMMARY OF THE INVENTION

It is, therefore, an object of the present invention to provide a novel and improved piezoelectric resonator vibrating in the thickness-extensional vibration mode in which the conventional defect is overcome i.e., the unwanted vibration responses are suppressed.

A further object of the present invention is to provide a novel and improved piezoelectric resonator having a smooth resonant characteristic and which is free from unwanted vibration responses.

A further object of the present invention is to provide a novel and improved piezoelectric resonator vibrating in the thickness-extensional mode and having a Poisson's ratio of less than one-third, which can be effectively used in a high frequency range and the resonant frequency of which can be easily set because it depends only upon the thickness of the piezoelectric plate between the electrodes thereon.

These and other objects are achieved by providing a piezoelectric resonator comprising a thin plate of piezoelectric material having Poisson's ratio of less than one-third and vibrating in the thickness-extensional mode at a pre-selected frequency when an electrical signal is applied thereto, said plate having two flat major surfaces opposed to each other and a recess provided in at least one of said two major surfaces and having a pair of electrodes on said two major surfaces at the position of said recess, and the relation between the thickness of said plate at said recess and the thickness of said plate at said flat part being such as to make the wave number of said flat part imaginary at the resonant frequency of the thickness-extensional vibration of said recess part.

BRIEF DESCRIPTION OF THE DRAWINGS

These and other objects and the advantages of the present invention will become apparent from the following description taken in connection with the attached drawings, wherein.

DETAILED DESCRIPTION OF THE PREFERRED EMBODIMENT

Figure 1:
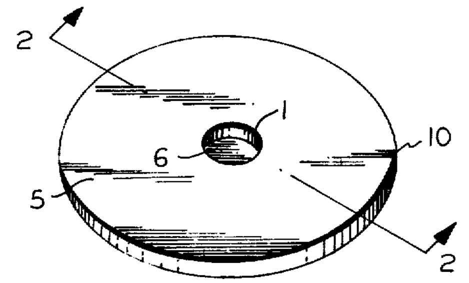
FIG. 1 is a perspective view of an embodiment of a piezoelectric resonator according to the present invention.
Figure 2:
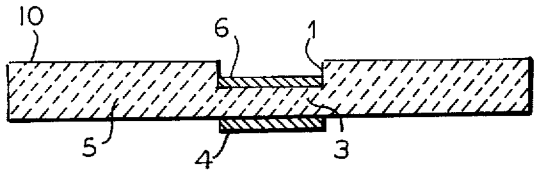
FIG. 2 is a sectional view of a piezoelectric resonator taken along the line 2—2 of FIG. 1.

Referring to FIG. 1, a piezoelectric resonator according to the present invention comprises a thin plate 10 of piezoelectric material having a flat part 5, with spaced major surfaces on the opposite sides thereof, and having a flat bottomed recess 1 formed in one of said major surfaces and an electrode 6 on the flat bottom surface within view of the piezoelectric resonator shown in FIG. 1 taken along the line 2—2 is shown in FIG. 2 to illustrate the structure of the resonator in more detail, in which the same parts as those of FIG. 1 are designated by the reference numerals corresponding to those of FIG. 1. A second electrode 4 is positioned on the other major surface of the resonator, the electrode 6 in the recess 1 as described above and the electrode 4 being opposed to each other to form a pair of electrodes.

The material of the piezoelectric plate can be any monocrystalline piezoelectric material or piezoelectric ceramic material having a Poisson's ratio less than one third. For example, lead titanate piezoelectric ceramics are suitable for the piezoelectric plate of the resonator of the invention. It has been disclosed that lead titanate piezoelectric ceramics containing certain additives have a value of Poisson's ratio as low as 0.2, see, for example Ikegami, et al., in the Journal of the Acoustical society of America, Vol. 50, No. 4, Part 1, pp. 1,060–1066, October, 1971. The direction of polarization of the piezoelectric plate is determined according to the thickness-extensional vibration which is produced when an electric signal is applied between the electrodes 6 and 4. For practical use of the piezoelectric ceramic plate in the resonator, the polarization direction is caused to coincide with the thickness-direction of the ceramic plate.

The recess 1 is formed by a suitable and conventional mechanical machining method such as ultrasonic machining and sandblasting machining. It is also possible to use a chemical machining method such as chemical etching and photoetching. It is also possible to provide the recess during the process of forming the ceramic plate prior to the sintering of the ceramic material.

The electrodes 6 and 4 are applied on the major surfaces of the piezoelectric plate, at the required positions as described above, by a suitable and conventional method using a conventional conductive material, such as electroless metal plating, metal evaporation and metal painting and firing. For example, silver-copper electrodes provide good results because they have a thin and uniform thickness less than 1μm and a low elastic loss. In addition, the shape of the silver-copper electrodes can be closely controlled by means of chemical etching and/or photoetching. These silver-copper electrodes can be applied by electroless copper plating and silver immersion plating.

The relation between the thickness of the plate 1 at the recess 3 and the thickness at the flat part 5 is very important for eliminating the unwanted vibration responses. This will be described in detail hereinafter together with a theoretical consideration.

Figure 3:
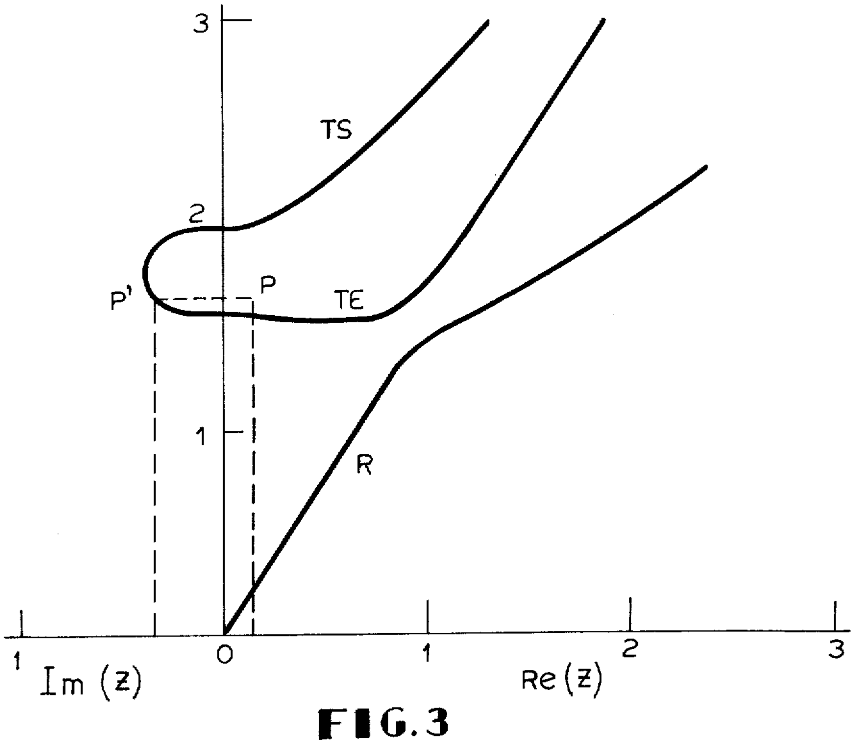
FIG. 3 is a graph showing dispersion curves for explaining the operation of the piezoelectric resonator of the invention.

Referring to FIG. 3, the dispersion curves of the thickness-extensional vibration of an elastic plate are shown. In FIG. 3, the ordinate represents a normalized frequency Ω, and the abscissa represents a real part of the wave number Re(Z) and an imaginary part of the wave number Im(Z). On the Ω-Re(Z) plane, there are three curves, and they correspond to the thickness-shear vibration TS, the thickness-extensional vibration TE and the radial vibration R, respectively. When the Poisson's ratio of the elastic plate is less than one-third, the frequency of the curve TE becomes lower than that of the curve TS, and the curve TE connects with the curve TS in the Ω-Im(Z) plane, as shown in FIG. 3. This situation occurs only for the thickness-extensional vibration of an elastic plate having a Poisson's ratio less than one-third, as was proved by R. D. Mindlin and M. A. Medick, in the J. Applied Mechanics, vol. 26, Trans. A. S. M. E. 81, Series E. pp. 561 ~ 569, 1959.

Now, it is supposed that a recess is provided in the surface of the elastic plate. The resonant frequency of the thickness-extensional vibration at the recess part will be increased due to the decrease of the thickness thereat. This resonant point is represented by a point P shown in FIG. 3. If the thickness-extensional vibration of the recess part is caused to occur at the point P, the wave number of the vibration at the flat part becomes imaginary, as shown by a point P' on curve TE. A vibration the wave number of which is imaginary can not propagate very substantially through an elastic medium. Accordingly, the forced thickness-extensional vibration at the recess part is attenuated exponentially in the region of the flat part. In other words, the thickness-extensional vibration is confined to the recess part. Therefore, no reflections and dissipations of the vibration occur at the peripheral edge of the elastic plate, since there are no vibrations. Accordingly, the unwanted vibration responses can be eliminated.

The concept of the invention described above can be carried out by using a piezoelectric plate having a Poisson's ratio less than one-third. In this case, the piezoelectric plate acts as an elastic plate as well as a piezoelectic plate. Referring again to FIG. 1 and FIG. 2, the thickness-extensional vibration at the recess can be easily caused by using a pair of the electrodes 6 and 4 applied to the opposite surfaces of the plate at the part 3 corresponding to the recess 1. When an electrical signal having a frequency of the resonant frequency of the thickness-extensional vibration mode is applied between the pair of the electrodes 6 and 4, the recess part 3 is forced to vibrate mode in the thickness-extensional vibration. The strength of the vibration depends on the mechanical quality factor $Q_M$ and the coupling factor $k_t$ of the piezoelectric plate 10.

As on embodiment of the invention, there will be described in the following example a piezoelectric resonator using the afore-said lead titanate piezoelectric ceramics.

EXAMPLE

The physical constants of the lead titanate ceramic used are shown in Table 1. In the Table 1, $\sigma$, $k_t$, $Q_M$, $N_t$, $\rho$ and $E_{33}^T$ represent the Poisson's ratio, coupling factor, mechanical quality factor, frequency constant density and relative dielectric constants, respectively.

Table 1

| | |
|---|---|
| $\sigma$ | 1/5 |
| $k_t$ | 0.46 |
| $Q_M$ | 1100 |
| $N_t$(Hz.m) | 2070 |
| $\rho$(kg/m³) | $7.87 \times 10^3$ |
| $E_{33}^T$ | 170 |

Two ceramic disk shaped plates having a diameter of 10mm were prepared by using lead titanate ceramic, and two types of the piezoelectric resonators were made. One of the piezoelectric resonators had a structure as shown in FIGS. 1 and 2, and the other resonator was shaped similarly to a conventional piezoelectric resonator having electrodes on limited areas of both of the flat surfaces of the plate. The physical dimensions of these resonators were as shown in Table 2, in which Type 1 is the resonator having the recess and Type 2 corresponds to the conventional resonator.

Table 2

| | Type 1 | Type 2 |
|---|---|---|
| d(mm) | 0.75 | 0.94 |
| t'(mm) | 0.116 | 0.119 |
| t(mm) | 0.103 | 0.119 |

In the Table 2, $d$, $t'$ and t represent the diameter of the electrode, the thickness of the flat part and the thickness of the recess part, respectively.

Figure 5:
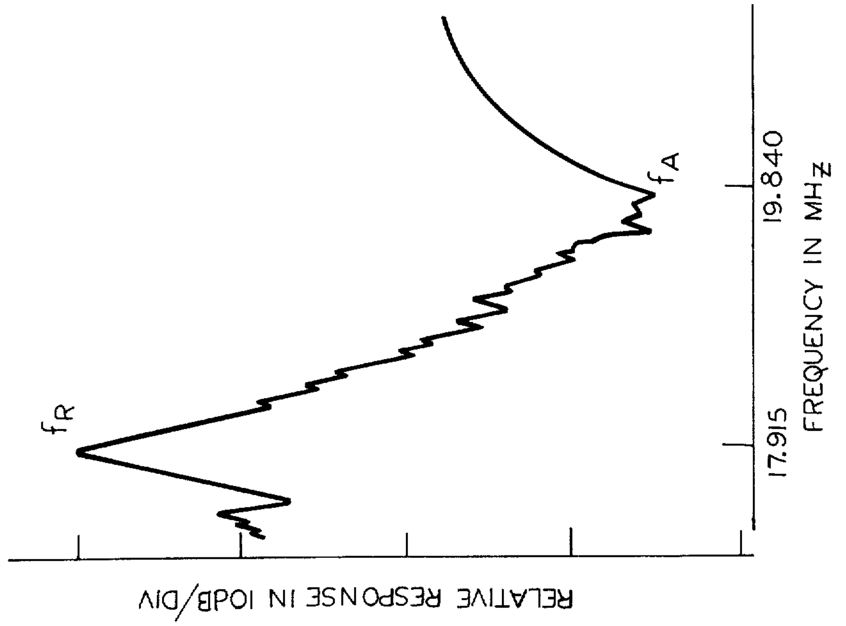
FIG. 5 is a graph showing a frequency response curve of a conventional piezoelectric resonator, which is illustrated for comparison.
Figure 4:
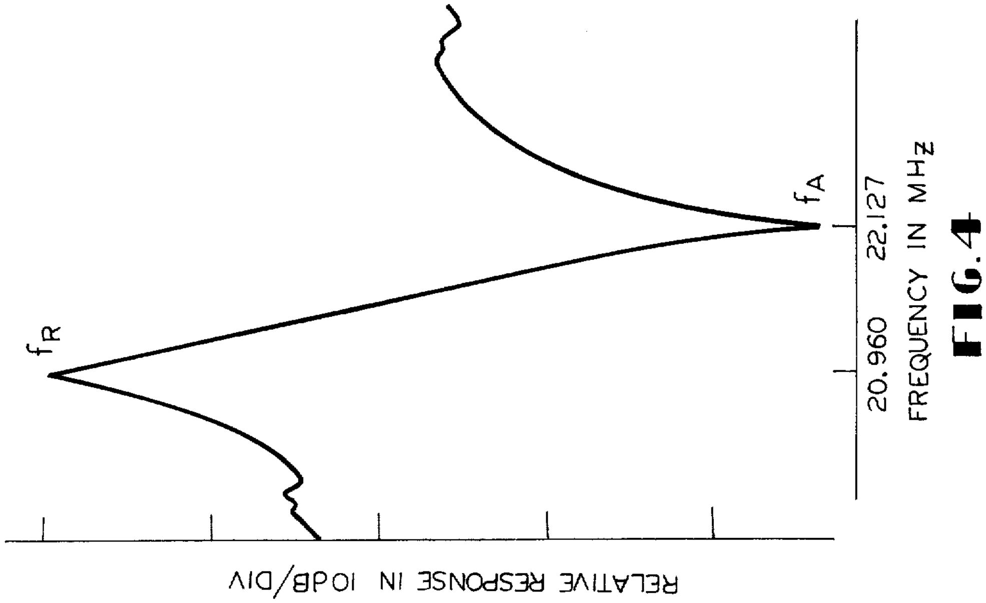
FIG. 4 is a graph showing a frequency response curve of a piezoelectric resonator of the invention.

Frequency response curves of the Type 1 and Type 2 resonators were measured and found to be as shown in FIG. 4 and FIG. 5, respectively, in which the ordinate represents a relative response of an admittance of the piezoelectric resonator and the abscissa represents a frequency. The frequencies $f_R$ and $f_A$ of the maximum and minimum admittances correspond to the resonant and the anti-resonant frequencies of the thickness-extensional vibration, respectively.

Comparing FIG. 4 with FIG. 5, it is clearly noticed that there is an extreme difference in the frequency response curves. In FIG. 4, the thickness-extensional vibration caused between the pair of electrodes is confined to the recess part, and there is no other induced vibration response at least in the range between the resonant and the anti-resonant frequencies of the thickness-extensional vibration. On the contrary, in FIG. 5, there are many vibration responses between those frequencies of the thickness-extensional vibration. This is because the thickness-extensional vibration can not, in the conventional electrode, be confined in the region having the electrodes thereon, and many vibration responses are induced owing to reflection at the peripheral edge of the piezoelectric resonator.

In order to confine the thickness-extensional vibration at the recess part, the relation between the thickness $t'$ of the flat part and the thickness of the recess part $t$ is important. It is desirable that this relation satisfy the following equation;

$$(N_{TA}/2N_S) < (t/t') < (N_{TS}/N_{TA}) \qquad (1)$$

where $N_S$, $N_{TS}$ and $N_{TA}$ are frequency constants for the thickness-shear vibration, the thickness-extensional vibration and the anti-resonant thickness-extensional vibration, respectively. In the case of the aforesaid lead titanate piezoelectric ceramic, the equation (1) can be represented by the following equation;

$$0.859 < (t/t') < 0.908 \qquad (2)$$

There is no critical relation for the diameter $d$ of the recess part, as there is for the thickness relation. If the ratio of the diameter to thickness $d/t$ is less than 20, the diameter can be chosen to achieve the desired impedance value.

Figure 6:
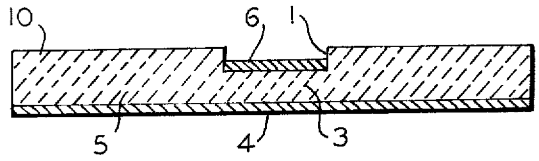
FIGS. 6 to 10 are sectional views of other embodiments of a piezoelectric resonator according to the invention, respectively.

Referring to FIG. 6 which shows a modified piezoelectric resonator according to the present invention, the electrode 4 is applied to the entire area of said other major surface of the piezoelectric plate 10. According to the present invention, an electrode 4 having this larger area will also be operable to produce the aforementioned confined vibration as it includes at least the area corresponding to the recess part 3.

Figure 7:
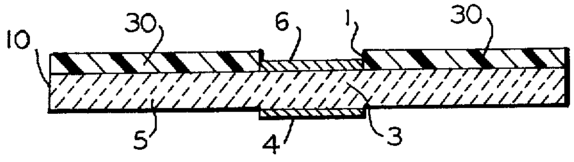

FIG. 7 shows another embodiment of the present invention. In FIG. 7, the recess 1 is made by using an elastic wafer 30 having a hole, the hole serving as the recess. According to the present invention, the increase of the resonant frequency of the recess part 3 is one of the most important conditions, and the elastic wafer 30 having the hole can be successfully applied so as to achieve an increase of the resonant frequency. Operable elastic wafers 30 include epoxy resin wafers and a wafer made by glass painting.

Figure 8:
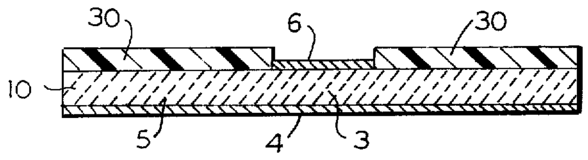

Referring to FIG. 8, still another embodiment of the present invention is shown. In this case, the piezoelectric resonators illustrated in FIG. 6 and FIG. 7 are combined.

Figure 9:
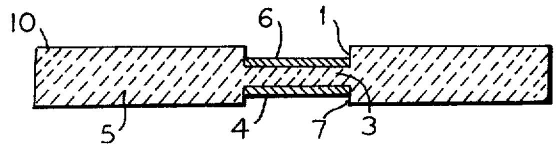

Referring to FIG. 9, a still further embodiment of the present invention is shown. In this case, a pair of recesses 1 and 7 are provided on the opposite sides of the plate 10 at the recess part 3, and the electrodes 6 and 4 are applied to the bottom surfaces of the recesses. By providing a pair of recesses 1 and 7, the thickness-extensional vibration can be substantially confined in the recess part 3 which has a smaller thickness than that of the flat part. Such a structure has the advantage that the surface of the flat part 5 can be fixed on a supporting system, because no mechanical displacement of the flat part 5 takes place. This construction of the piezoelectric resonator is especially advantageous for resonator mounting, since the flat part can be used for a vibration protector.

Figure 10:
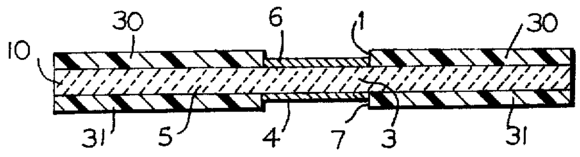

Referring to FIG. 10, a still further modified piezoelectric resonator is shown. In this case, the piezoelectric resonators of FIGS. 8 and 9 are combined. The recesses are formed by using a pair of elastic plates 30 and 31 each having hole therein, respectively. Each of the elastic plates having a hole is the one described in connection with FIG. 7.

Figure 11:
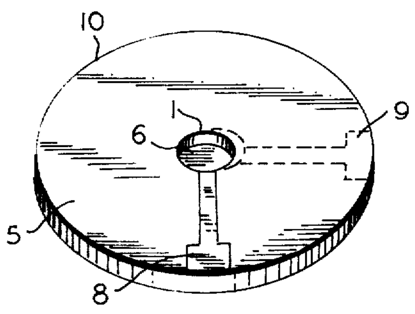
FIG. 11 is a perspective view of still another modification of the piezoelectric resonator embodying the invention.

Referring to FIG. 11, a still further modified piezoelectric resonator according to the invention is shown. In FIG. 11, a pair of electrical terminals 8 and 9 are formed on the surfaces of the flat part 5 and they are connected electrically to a pair of the electrodes 6 and 4, respectively. On the flat part, the thickness extensional vibration does not propagate, so that the pair of electrical terminals 8 and 9 can have lead wires soldered directly thereto without worring about change of the vibration response. When applying the pair of electrodes to the surfaces of the flat part, it is important to arrange the electrode terminals at locations where they are not opposed to each other. If the electrical terminals are opposed to each other through the plate, there is caused a new vibration at that place due to the piezoelectric effect in the flat part. This forced vibration will cause unwanted vibration responses.

While several embodiments of the invention have been disclosed in the above, it will be apparent that many additional structual and compositional variations are possible without departing from the scope of the invention as defined in the appended claims.

What is claimed is:

1. A piezoelectric resonator comprising a thin plate of piezoelectric material having a Poisson's ratio less than one-third, said plate having two flat spaced major surfaces on opposite sides thereof and a flat bottomed recess in at least one of said two major surfaces, and a pair of electrodes, one on the bottom of said recess and the other on the major surface at least in the area opposite the position of said recess, said recessed part of said plate vibrating in the fundamental thickness-extensional mode at a pre-selected frequency when an electrical signal is applied thereto, the thickness $t$ of said plate at said recess and the thickness $t'$ of said plate at said flat part being in the relationship $(N_{TA}/2N_S) < (t/t') < (N_{TS}/N_{TA})$ where $N_S$, $N_{TS}$ and $N_{TA}$ are frequency constants for the thickness-shear vibration, the thickness-extensional vibration and the anti-resonant thickness-extensional vibration, respectively, whereby the resonant frequency of said fundamental thickness-extension vibration of said plate at said recessed part is higher than the resonant frequency of said plate at said flat part.

2. A piezoelectric resonator as claimed in claim 1, further comprising a pair of electrical terminals on said two major surfaces respectively, said electrical terminals being connected to said electrodes respectively and with the area of one major surface on the opposite side of the plate from one of said electrical terminals being different from the area on said one major surface, covered by the other electrical terminal provided on said one major surface.

3. A piezoelectic resonator as claimed in claim 1, wherein said piezoelectric plate has one recess provided in one of said two major surfaces, one of said electrodes being in said recess and the other electrode being on the other major surface at a portion which includes at least the area opposite said recess.

4. A piezoelectric resonator as claimed in claim 3, wherein said other electrode is on the whole area of said other major surface and said other major surface has no recess therein.

5. A piezoelectric resonator as claimed in claim 1, wherein said piezoelectric plate has a recess in each of said two major surfaces, respectively, said two recesses being opposite each other and said electrodes being in said recesses, respectively.

6. A piezoelectric resonator as claimed in claim 1, wherein said piezoelectric plate is of a lead titanate piezoelectric ceramic and the ratio of the thickness of said plate between said recess and the thickness of said plate at said flat part being from 0.859 to 0.908.

7. A piezoelectric resonator as claimed in claim 1, wherein said lead titanate ceramic has as its main component a solid solution of $PbTiO_3$.

8. A piezoelectric resonator vibrating in the thickness-extensional vibration mode comprising a thin plate of a lead titanate piezoelectric ceramic having a Poisson's ratio of less than one third and which plate vibrates in the thickness-extensional mode at a preselected frequency when an electrical signal is applied thereto, said piezoelectric plate having a flat part defined by two spaced flat major surfaces on opposite sides thereof and an elastic wafer having a hole therein on each major surface, said holes defining a pair of recesses, one on each of said two major surfaces respectively, said recesses being opposite each other through said plate, a pair of electrodes with one electrode in each of said recesses, and a pair of electrical terminals, one on each of said two major surfaces respectively, said electrical terminals being connected to the respective electrodes with the area of one major surface on the opposite side of the plate from one of said electrical terminals being different from the area on said one major surface, covered by the other electrical terminal provided on said one major surface, and the ratio of the thickness of said plate between said recesses and the thickness of said plate at said flat part being ranged from 0.859 to 0.908.

9. A piezoelectric resonator vibrating in the thickness-extensional vibration mode comprising a thin plate of a piezoelectric ceramic material having a Poisson's ratio of less than one-third and which plate vibrates in the thickness-extensional mode at a preselected frequency when an electrical signal is applied thereto, said piezoelectic plate having two spaced flat major surfaces on opposite sides thereof, an elastic wafer having a hole therein on at least one major surface, said hole defining a recess, a pair of electrodes with one electrode in said recess and the other being on the opposite surface of said plate in at least the area corresponding to said one electrode, said part of said plate in said recess vibrating in the fundamental thickness-extensional mode at said pre-selected frequency when an electrical signal is applied thereto, the thickness $t$ of said plate at said recess and the thickness $t'$ of said plate plus said wafer being in the relationship $(N_{TA}/2N_S) < (t/t') < (N_{TS}/N_{TA})$ where $N_S$, $N_{TS}$ and $N_{TA}$ are frequency constants for the thickness-sheer vibration, the thickness-extensional vibration, and the anti-resonant thickness-extensional vibration, respectively, whereby the resonant frequency of said fundamental thickness-extension vibration of said plate at the part corresponding to said recess is higher than the resonant frequency of the remainder of said plate.

* * * * *